US011736851B2

United States Patent
Yang et al.

(10) Patent No.: US 11,736,851 B2
(45) Date of Patent: Aug. 22, 2023

(54) WIRELESS PLAYBACK DEVICE, AND PLAYBACK CONTROL METHOD AND APPARATUS THEREOF

(71) Applicant: GOERTEK INC., Shandong (CN)

(72) Inventors: Zongxu Yang, Shandong (CN); Tao Sui, Shandong (CN); Haizhu Xu, Shandong (CN); Feixiang Liu, Shandong (CN)

(73) Assignee: GOERTEK INC., Weifang (CN)

( * ) Notice: Subject to any disclaimer, the term of this patent is extended or adjusted under 35 U.S.C. 154(b) by 286 days.

(21) Appl. No.: 17/298,227

(22) PCT Filed: Dec. 26, 2018

(86) PCT No.: PCT/CN2018/123913
§ 371 (c)(1),
(2) Date: May 28, 2021

(87) PCT Pub. No.: WO2020/107604
PCT Pub. Date: Jun. 4, 2020

(65) Prior Publication Data
US 2022/0116696 A1      Apr. 14, 2022

(30) Foreign Application Priority Data

Nov. 29, 2018    (CN) .......................... 201811443568.5

(51) Int. Cl.
*A61F 11/06*      (2006.01)
*G10K 11/16*      (2006.01)
(Continued)

(52) U.S. Cl.
CPC ....... *H04R 1/1041* (2013.01); *H03F 3/45475* (2013.01); *H04R 1/1083* (2013.01);
(Continued)

(58) Field of Classification Search
CPC .. H04R 1/1041; H04R 1/1083; H03F 3/45475
See application file for complete search history.

(56) References Cited

U.S. PATENT DOCUMENTS

| 8,620,007 | B2 * | 12/2013 | Lee ........................... H03G 3/02 381/104 |
| 10,412,479 | B2 * | 9/2019 | Zhao ....................... H03M 1/12 |

(Continued)

FOREIGN PATENT DOCUMENTS

| CN | 101023704 | 8/2007 |
| CN | 101258770 | 9/2008 |

(Continued)

OTHER PUBLICATIONS

International Search Report issued in PCT/CN2018/12913 dated Jun. 28, 2019.

*Primary Examiner* — Simon King
(74) *Attorney, Agent, or Firm* — Workman Nydegger

(57) ABSTRACT

Disclosed in the present disclosure are a wireless playback device, a playback control method thereof, and a head-mounted wireless headset system. The device includes: a housing, a headband detection device, a processor, a power amplifier (PA) operational amplification device, and a speaker. The headband detection device collects connection condition data of a headband device and the housing. The processor is connected to the headband detection device and controls the PA operational amplification device to adjust an operation power mode of the speaker according to the connection condition data. The PA operational amplification device is connected to the processor and the speaker, respectively, and adjusts the operation power mode of the speaker according to control of the processor. Therefore, the function automatically switching the headphone function and a small speaker function is realized, and the user experience is improved.

20 Claims, 4 Drawing Sheets

(51) Int. Cl.
*H03B 29/00* (2006.01)
*H04R 1/10* (2006.01)
*H03F 3/45* (2006.01)

(52) U.S. Cl.
CPC ...... *H03F 2200/03* (2013.01); *H04R 2420/07* (2013.01); *H04R 2460/01* (2013.01)

(56) References Cited

U.S. PATENT DOCUMENTS

| | | | |
|---|---|---|---|
| 2006/0233388 A1 | 10/2006 | Liow | |
| 2007/0076897 A1* | 4/2007 | Philipp | H04R 1/1041 381/74 |
| 2008/0279403 A1 | 11/2008 | Pedersen | |
| 2018/0132028 A1* | 5/2018 | Nakai | H04R 1/1041 |
| 2018/0234757 A1* | 8/2018 | Christoph | G10K 11/16 |
| 2020/0026104 A1* | 1/2020 | Wang | G02F 1/0121 |

FOREIGN PATENT DOCUMENTS

| | | |
|---|---|---|
| CN | 202424997 | 9/2012 |
| CN | 105338447 | 2/2016 |

\* cited by examiner

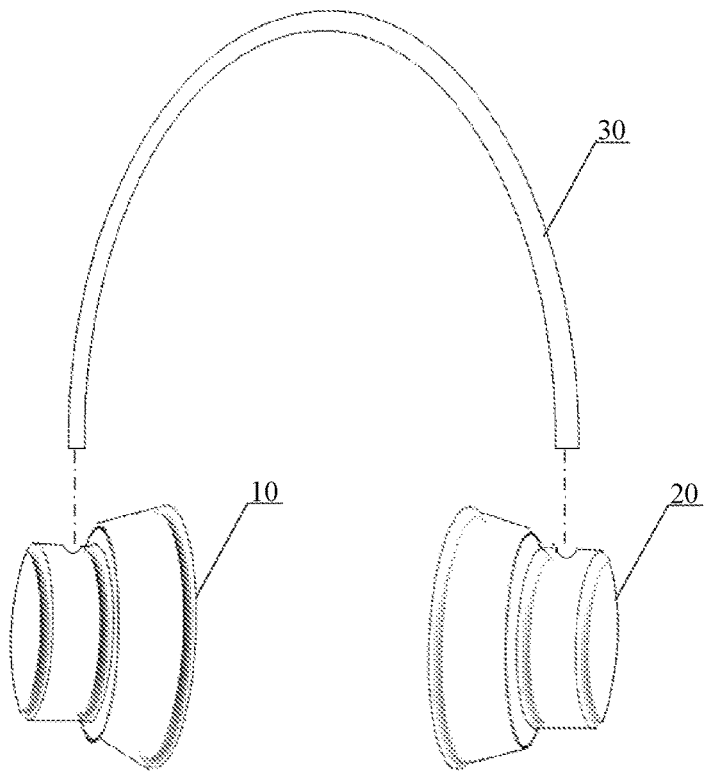

Figure 4

S101 — acquiring a connection condition between a wireless playback device and a headband device, where the connection condition includes a connected state and an unconnected state S102 — controlling, according to the connection condition, a PA operational amplification device to adjust an operation power mode of a speaker, where the PA operational amplification device and the speaker are both provided in the wireless playback device

Figure 5

WIRELESS PLAYBACK DEVICE, AND PLAYBACK CONTROL METHOD AND APPARATUS THEREOF

The present application is the U.S. national phase of International Application No. PCT/CN2018/123913, titled "Wireless Playback Device, And Playback Control Method And Apparatus Thereof", filed on Dec. 26, 2018, which claims priority to Chinese Patent Application No. 201811443568.5, titled "WIRELESS PLAYBACK DEVICE, AND PLAYBACK CONTROL METHOD AND APPARATUS THEREOF", filed on Nov. 29, 2018 with the China National Intellectual Property Administration, which are incorporated herein by reference in their entirety

FIELD

The present disclosure relates to the technical field of portable listening devices, and in particular to a wireless playback device, a head-mounted wireless headset system, a playback control method and apparatus of a wireless playback device, and a computer-readable storage medium.

BACKGROUND

With the development of wireless communication technology, a trend of intelligent and wireless has been deeply reflected in wireless headset products such as Bluetooth headsets. The latest True Wireless Stereo (TWS) Bluetooth headset is a typical wireless headset that combines and balances between the intelligence and the wireless. Such wireless headset product often needs to be equipped with a charging box with storage and charging functions.

In conventional technologies, a wireless playback device such as the TWS Bluetooth headset is often an in-ear wireless headset or a semi-in-ear wireless headset, and a wireless playback device similar to an earpiece of a traditional head-mounted headset has not yet been popularized. Compared with the existing in-ear wireless headsets and semi-in-ear wireless headsets, the wireless playback device similar to the earpiece of the traditional head-mounted headset has the following advantages: said wireless playback device is larger in size, so that a radio frequency antenna is no longer restricted by a narrow space, and a radio frequency performance can be greatly improved; a touch area is greatly increased, which can realize multi-functional and humanized control; a placement of a microphone (MIC) and other components can be further optimized to achieve better noise reduction effects; a battery capacity can be greatly improved, increasing usage time of a user; a 3.5 mm interface and a TYPE-C interface may be expanded, which can realize wired audio playback and get rid of the limitation of the charging box; and application scenarios can also be expanded to realize a small speaker function.

Therefore, how to enable a user to use the wireless playback device such as the TWS Bluetooth headset in a product form similar to the traditional head-mounted headset, and automatically switch a headphone function and the small speaker function according to user's needs to improve the user experience, is an urgent problem to be solved.

SUMMARY

An object of embodiments of the present disclosure is to provide a wireless playback device, a head-mounted wireless headset system, a playback control method and apparatus of a wireless playback device, and a computer-readable storage medium, which enable a user to use a wireless playback device in a product form similar to a traditional head-mounted headset, and automatically switch a headphone function and a small speaker function to improve the user experience.

To solve the above technical problems, a wireless playback device is provided according to an embodiment of the present disclosure. The wireless playback device includes: a housing, a headband detection device, a processor, a power amplifier (PA) operational amplification device, and a speaker, where the headband detection device, the processor, the PA operational amplification device and the speaker are provided in the housing. The headband detection device is configured to collect connection condition data of a headband device and the housing. The processor is connected to the headband detection device, and is configured to control the PA operational amplification device to adjust an operation power mode of the speaker according to the connection condition data. The PA operational amplification device is connected to the processor and the speaker respectively, and is configured to adjust the operation power mode of the speaker according to control of the processor.

In another embodiment of the present disclosure, the wireless playback device further includes an active noise cancellation device provided in the housing. The active noise cancellation device is connected to the processor, and is configured to perform active noise cancellation on an audio played by the speaker according to the control of the processor.

In another embodiment of the present disclosure, the wireless playback device further includes a wearing detection device provided in the housing. The wearing detection device is connected to the processor, and is configured to detect wearing condition data of the wireless playback device according to the control of the processor. The processor is configured to control the PA operational amplification device to adjust the operation power mode of the speaker according to the connection condition data and the wearing condition data.

In another embodiment of the present disclosure, the wearing detection device is a distance sensor and/or an acceleration sensor.

In another embodiment of the present disclosure, the housing is provided with a headband jack, and the headband jack is configured for detachably connecting with the headband device plugged into the headband jack.

In another embodiment of the present disclosure, the headband detection device is an interrupt detection circuit. The interrupt detection circuit includes a resistor and a key switch provided at a bottom of the headband jack, where a first end of the resistor is connected to a signal input terminal of the processor, a common end of the resistor and the processor is connected to a first end of the key switch, a second end of the resistor is connected to an output terminal of a preset power supply, and a second end of the key switch is grounded.

In another embodiment of the present disclosure, the headband detection device is a distance sensor.

A head-mounted wireless headset system is further provided in an embodiment of the present disclosure. The head-mounted wireless headset system includes: a headband device, a first wireless playback device, and a second wireless playback device. The headband device is detachably connected with a housing of the first wireless playback device and a housing of the second wireless playback device, respectively, and each of the first wireless playback device and the second wireless playback device is the wireless playback device according to any one of the foregoing embodiments.

In another embodiment of the present disclosure, the headband device includes an arcuate headband, a battery, a first connector, and two second connectors, where the battery, the first connector and the two second connectors are provided in the arcuate headband. The first connector is connected to the battery, and is configured to detachably connect with an external power supply device to charge the battery. The two second connectors are respectively provided at both ends of the arcuate headband. The battery is connected to each of the two second connectors and is configured to supply power to the first wireless playback device and the second wireless playback device, and the first wireless playback device and the second wireless playback device are detachably connected with the two second connectors.

A playback control method of a wireless playback device is further provided in an embodiment of the present disclosure. The playback control method includes:

acquiring a connection condition between a wireless playback device and a headband device, where the connection condition includes a connected state and an unconnected state; and controlling, according to the connection condition, a power amplifier (PA) operational amplification device to adjust an operation power mode of a speaker, where the PA operational amplification device and the speaker are both provided in the wireless playback device.

In another embodiment of the present disclosure, the controlling, according to the connection condition, the PA operational amplification device to adjust the operation power mode of the speaker includes:

controlling, in a case that the connection condition is the connected state, the PA operational amplification device to adjust the speaker to operate in a low power mode; and controlling, in a case that the connection condition is the unconnected state, the PA operational amplification device to adjust the speaker to operate in a high power mode.

In another embodiment of the present disclosure, the acquiring the connection condition between the wireless playback device and the headband device includes:

acquiring the connection condition according to a headband detection device provided in the wireless playback device.

In another embodiment of the present disclosure, in a case that the headband detection device is an interrupt detection circuit, the acquiring the connection condition according to the headband detection device provided in the wireless playback device includes:

determining whether an interrupt signal sent by the interrupt detection circuit is received, where the interrupt detection circuit sends the interrupt signal when the headband device is connected to the wireless playback device;

determining, in a case that the interrupt signal is received, that the connection condition is the connected state; and determining, in a case that the interrupt signal is not received, that the connection condition is the unconnected state.

In another embodiment of the present disclosure, the controlling, according to the connection condition, the PA operational amplification device to adjust the operation power mode of the speaker includes:

acquiring a wearing condition of the wireless playback device, where the wearing condition includes a worn state and an unworn state; and controlling, according to the connection condition and the wearing condition, the PA operational amplification device to adjust the operation power mode of the speaker.

In another embodiment of the present disclosure, the controlling, according to the connection condition and the wearing condition, the PA operational amplification device to adjust the operation power mode of the speaker includes:

determining whether the connection condition is the connected state;

in a case that the connection condition is the connected state, determining whether the wearing condition is the worn state;

controlling, in a case that the wearing condition is the worn state, the PA operational amplification device to adjust the speaker to operate in a low power mode; and stopping, in a case that the wearing condition is not the worn state, the speaker from playing audio; and in a case that the connection condition is not the connected state, determining whether the wearing condition is the worn state;

controlling, in a case that the wearing condition is the worn state, the PA operational amplification device to adjust the speaker to operate in the low power mode; and controlling, in a case that the wearing condition is not the worn state, the PA operational amplification device to adjust the speaker to operate in a high power mode.

In another embodiment of the present disclosure, before the controlling the PA operational amplification device to adjust the speaker to operate in the high power mode, the method further includes:

determining whether the wearing condition is not the worn state within a preset time period; and controlling, in a case that the wearing condition is not the worn state within the preset time period, the PA operational amplification device to adjust the speaker to operate in the high power mode.

In another embodiment of the present disclosure, after the controlling the PA operational amplification device to adjust the speaker to operate in the low power mode, the method further includes:

controlling an active noise cancellation device to perform active noise cancellation on an audio played by the speaker, where the active noise cancellation device is provided in the wireless playback device;

after the controlling the PA operational amplification device to adjust the speaker to operate in the high power mode, the method further includes:

controlling the active noise cancellation device to stop performing active noise cancellation on the audio played by the speaker.

A playback control apparatus of a wireless playback device is further provided in an embodiment of the present disclosure. The playback control apparatus includes:

an acquiring module, configured to acquire a connection condition between a wireless playback device and a headband device, where the connection condition includes a connected state and an unconnected state; and an control module, configured to control, according to the connection condition, a power amplifier (PA) operational amplification device to adjust an operation power mode of a speaker, where the PA operational amplification device and the speaker are both provided in the wireless playback device.

A computer-readable storage medium is further provided in an embodiment of the present disclosure. The computer-readable storage medium stores a computer program, and when the computer program is executed by a processor, the playback control method of the wireless playback device according to any one of the foregoing embodiments is performed.

The wireless playback device provided according to embodiments the present disclosure includes: the housing, the headband detection device, the processor, the PA operational amplification device, and the speaker, where the headband detection device, the processor, the PA operational amplification device and the speaker are provided in the housing. The headband detection device is configured to collect connection condition data of the headband device and the housing. The processor is connected to the headband detection device, and is configured to control the PA operational amplification device to adjust the operation power mode of the speaker according to the connection condition data. The PA operational amplification device is connected to the processor and the speaker respectively, and is configured to adjust the operation power mode of the speaker according to the control of the processor.

As seen from the above, the housings of the two wireless playback devices provided according to embodiments of the present disclosure are detachably connected with the headband device, so that the user can use the wireless playback devices in a product form similar to the traditional head-mounted headset. The processor can control the PA operational amplification device to adjust the operation power mode of the speaker according to the connection condition data collected by the headband detection device, so as to realize the function of automatically switching the headphone function and the small speaker function. Therefore, the user experience is improved. In addition, a head-mounted wireless headset system, a playback control method and apparatus of a wireless playback device, and a computer-readable storage medium are also provided according to the embodiments of the present disclosure, which have the above beneficial effects.

BRIEF DESCRIPTION OF THE DRAWINGS

For clearer illustration of the technical solutions according to embodiments of the present disclosure or conventional techniques, hereinafter briefly described are the drawings to be applied in embodiments of the present disclosure or conventional techniques.

Apparently, the drawings in the following descriptions are only some embodiments of the present disclosure, and other drawings may be obtained by those skilled in the art based on the provided drawings without creative efforts.

FIG. 4 is a three-dimensional schematic diagram of a head-mounted wireless headset system according to an embodiment of the present disclosure;

FIG. 5 is a flow chart of a playback control method of a wireless playback device according to an embodiment of the present disclosure;

DETAILED DESCRIPTION OF EMBODIMENTS

In order to help those skilled in the art better understand solutions of the present disclosure, hereinafter technical solutions in embodiments of the present disclosure are described clearly and completely in conjunction with the drawings in embodiments of the present disclosure. Apparently, the described embodiments are only some rather than all of the embodiments of the present disclosure. Any other embodiments obtained based on the embodiments of the present disclosure by those skilled in the art without any creative effort fall within the scope of protection of the present disclosure.

Figure 1:
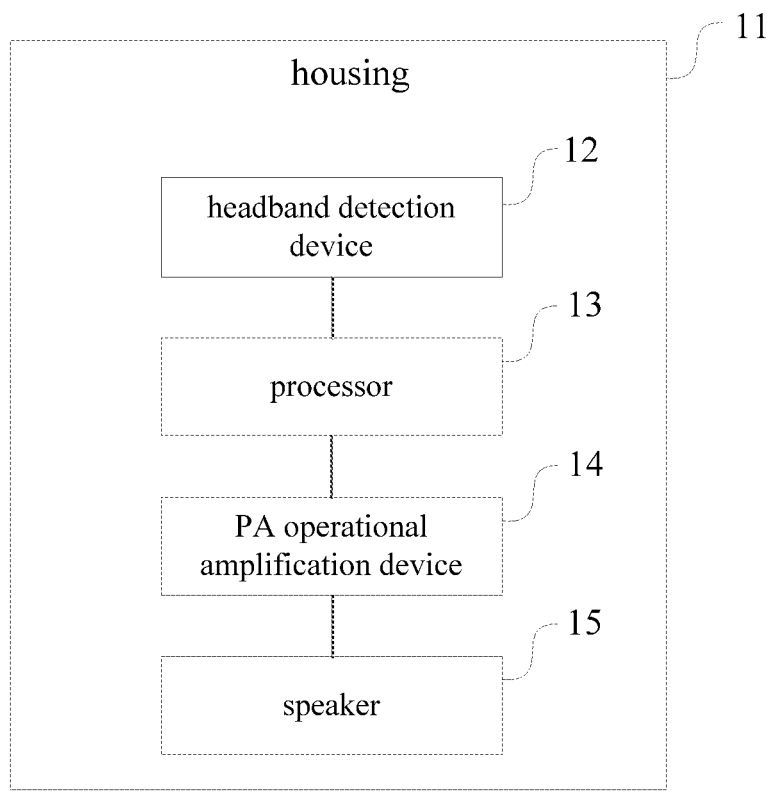
FIG. 1 is a block structural diagram of a wireless playback device according to an embodiment of the present disclosure.

Reference is made to FIG. 1, which is a block structural diagram of a wireless playback device according to an embodiment of the present disclosure. The wireless playback device includes: a housing 11, and a headband detection device 12, a processor 13, a power amplifier (PA) operational amplification device 14, and a speaker 15 which are all provided in the housing 11.

The headband detection device 12 is configured to collect connection condition data of a headband device and the housing 11.

The processor 13 is connected to the headband detection device 12, and is configured to control the PA operational amplification device 14 to adjust an operation power mode of the speaker 15 according to the connection condition data.

The PA operational amplification device 14 is connected to the processor 13 and the speaker 15, respectively, and is configured to adjust the operation power mode of the speaker 15 according to control of the processor 15.

Figure 2:
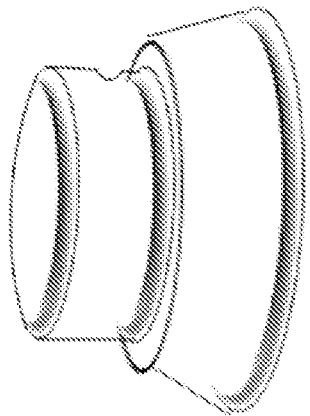
FIG. 2 is a three-dimensional schematic diagram of a housing of a wireless playback device according to an embodiment of the present disclosure.

According to the wireless playback device provided in this embodiment, the housing 11 may be detachably connected with the headband device, and automatically adjust the operation power mode of the speaker 15 according to the connection condition between the housing 11 and the headband device, so as to realize the function of automatically switching the headphone function and the small speaker function. That is, the product form of the wireless playback device is similar to that of the earpiece of the traditional head-mounted headset, and two wireless playback devices can be detachably connected with the headband device of which the product form is similar to the headband of the traditional head-mounted headset, so as to form the product which is similar to the traditional head-mounted headset. Specifically, the specific shape and structure of the housing 11, which serves as a main body of the wireless playback device, may be configured by a designer according to practical scenarios and user needs. As shown in FIG. 2, it can be configured to be the same as or similar to the earpiece of the traditional headsets, which is not limited in the embodiment of the present disclosure.

Figure 3:
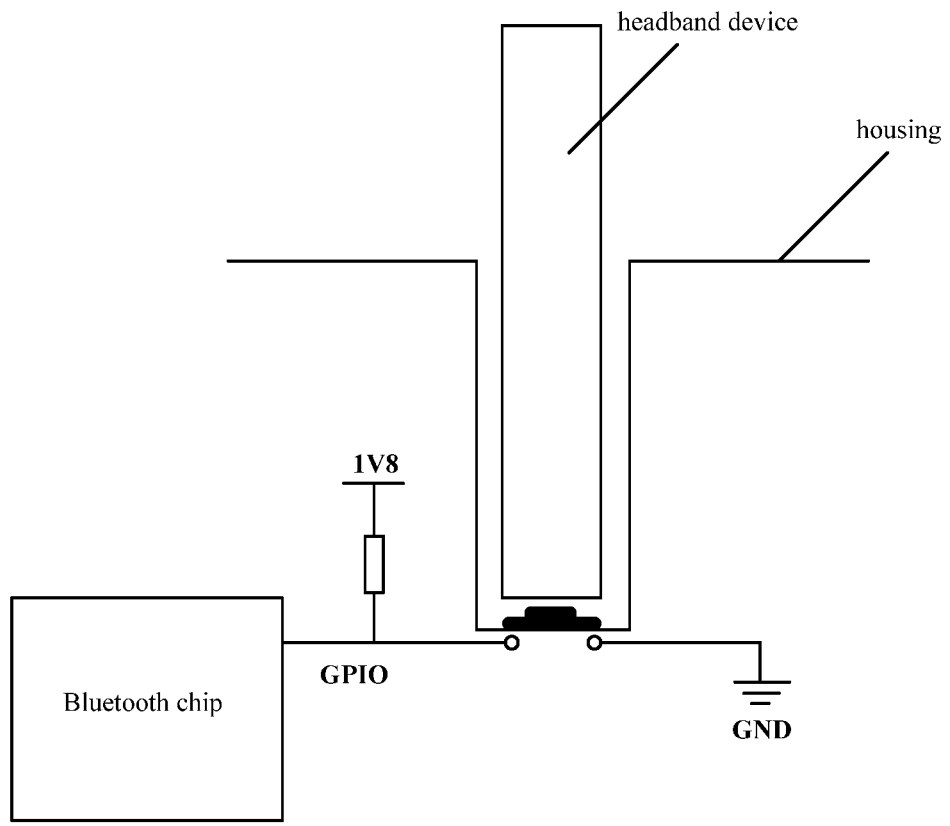
FIG. 3 is a schematic structural diagram of a headband detection device of a wireless playback device according to an embodiment of the present disclosure.

The object of this embodiment is that the wireless playback device utilizes the headband detection device 12 to collect connection condition data of the headband device and the housing 11, so that the processor 13 controls the PA operational amplification device 14 to adjust the operation power mode of the speaker 15 according to the connection condition data collected by the headband detection device 12, to realize the function of automatically switching the headphone function and the small speaker function. Specifically, the specific structure and type of the headband detection device 12 may be configured by a designer according to practical scenarios and user needs. It may be an interrupt detection circuit that generates a corresponding interrupt signal according to the connection condition between the headband device and the housing 11. As shown in FIG. 3, the housing 11 is provided with a headband jack for detachably connecting with the headband device plugged into the headband jack, and the headband detection device 12 is an interrupt detection circuit including a resistor and a key switch provided at a bottom of the headband jack. A first end of the resistor is connected to a signal input terminal of the processor, a common end of the resistor and the processor is connected to a first end of the key switch, a second end of the resistor is connected to an output terminal of a preset power supply (1V8), and the second end of the key switch is grounded. That is, when the user plugs the headband device into a preset position of the headband jack in the housing 11, the headband device presses the key switch to turn it on, and the signal input terminal of the processor 13 (Bluetooth chip) detects a voltage value to be zero. When the user pulls the headband device out of the headband jack, the key switch is turned off, and the signal input terminal of the processor 13 (Bluetooth chip) detects a corresponding voltage value. Thus, the processor 13 determines the connection condition between the headband device and the housing 11 by detecting a GPIO (General Purpose Input/Output) interrupt. It may also be a sensor that generates corresponding sensor data according to the connection condition between the headband device and the housing 11. For example, a distance sensor, such as an infrared sensor, provided at the bottom of the headband jack, sends the collected distance data to the processor 13, and the processor 13 determines the distance between the distance sensor and the plugged headband device according to the distance data. When the distance between the distance sensor and the plugged headband device is less than a threshold, it is determined that the headband device is connected to the housing 11. Thus, the processor 13 determines the connection condition between the headband device and the housing 11 by the sensor data. The specific structure and type of the headband detection device are not limited herein.

Specifically, in this embodiment, the processor 13 controls the PA operational amplification device 14 to adjust the operation power mode of the speaker 15 according to the connection condition data collected by the headband detection device 12. The processor first determines the connection condition between the wireless playback device and the headband device according to the connection condition data, and then controls the PA operational amplification device 14 to adjust the speaker 15 to operate in the corresponding power mode according to the connection condition. For example, when the signal input terminal of the processor 13 detects that the voltage value is zero, that is, the GPIO interrupt is detected, and it is determined that the connection condition is a connected state. Correspondingly, the PA operational amplification device 14 is controlled to adjust the speaker 15 to operate in a low power mode, to realize the headphone function. When the signal input terminal of the processor 13 detects that the voltage value is not zero, that is, there is no GPIO interrupt detected, and it is determined that the connection condition is an unconnected state. Correspondingly, the PA operational amplification device 14 is controlled to adjust the speaker 15 to operate in a high power mode, to realize the small speaker function. A designer may configure it autonomously that the processor 13 controls the PA operational amplification device 14 to adjust the operation power mode of the speaker 15 according to the connection condition data collected by the headband detection device 12. For example, it can be implemented in a manner similar to the existing manner of processing and matching the data, as long as the processor 13 can utilize the connection condition data collected by the headband detection device 12 to realize the function the small speaker function, which is not limited herein.

In another embodiment of the present disclosure, the wireless playback device further includes an active noise cancellation (ANC) device provided in the housing 11. The ANC device is connected to the processor 13, and is configured to perform active noise cancellation on an audio played by the speaker 15 according to the control of the processor. For example, when the processor controls the PA operational amplification device 14 to adjust the speaker 15 to operate in the low power mode, the ANC device may be activated to perform active noise cancellation on the audio played by the speaker to realize the active noise cancellation function of the headset.

In another embodiment of the present disclosure, the wireless playback device provided in this embodiment further includes a wearing detection device provided in the housing 11. The wearing detection device is connected to the processor 13, and is configured to detect wearing condition data of the wireless playback device according to the control of the processor. Correspondingly, the processor 13 is specifically configured to control the PA operational amplification device 14 to adjust the operation power mode of the speaker 15 according to the connection data and the wearing condition data. That is, the processor 13 determines the wearing condition of the wireless playback device according to the wearing condition data collected by the wearing detection device, so as to control the PA operational amplification device 14 to adjust the operation power mode of the speaker 15 according to the connection data and the wearing condition data. Specifically, for the specific type and structure of the wearing detection device, wearing detection schemes of the in-ear or semi-in-ear TWS Bluetooth headsets in conventional technologies may be referred to. For example, the wearing detection device may be a distance sensor and/or an acceleration sensor to detect the wearing condition of the user, which includes a condition that the user holds the wireless playback device to an ear, a condition that the user wears the wireless playback device with an ear-hook, or a condition that the user wears the wireless playback with its housing connected to a headband device, etc., which is not limited herein.

In this embodiment, the housings 11 of two wireless playback devices provided according to embodiments of the present disclosure are detachably connected with the headband device, so that the user uses the wireless playback devices in a product form similar to the traditional head-mounted headset. In addition, the processor 13 controls the PA operational amplification device 14 to adjust the operation power mode of the speaker 15 according to the connection condition data collected by the headband detection device 12, so as to realize the function of automatically switching the headphone function and the small speaker function. Therefore, the user experience is improved.

Reference is made to FIG. 4, which is a 3D schematic diagram of a head-mounted wireless headset system according to an embodiment of the present disclosure. The system includes a headband device 30, a first wireless playback device 10, and a second wireless playback device 20.

The headband device 30 is detachably connected with a housing of the first wireless playback device 10 and a housing of the second wireless playback device 20, and the first wireless playback device 10 and the second wireless playback device 20 are the wireless playback device according to any one of the foregoing embodiments.

The housings 11 of the first wireless playback device 10 and the second wireless playback device 20 can be detachably connected with the headband device 30. A processor, such as a Bluetooth chip, can automatically adjust the operation power mode of the speaker 15 according to each connection condition between the housing and the headband device 30, so as to realize a function of automatically switching the headphone function and the small speaker function. Specifically, the specific form and structure of the headband device 30 may be configured by a designer according to practical scenarios and user needs, and may be configured in the same or similar manner as the earpiece of the existing headsets. As shown in FIG. 4, it may be directly configured as a simple and lightweight arcuate headband, which is not limited herein.

In another embodiment of the present disclosure, to ensure that the user can wear the first wireless playback device 10 and the second wireless playback device 20 for a long time, the headband device 30 in this embodiment is provided with a charging function for the first wireless playback device 10 and the second wireless playback device 20. For example, the headband device includes an arcuate headband, a battery, a first connector, and two second connectors, and the battery, the first connector and the second connector are provided in the arcuate headband.

The first connector is connected to the battery, and is configured to be detachably connected with an external power supply device to charge the battery. The two second connectors are arranged at both sides of the arcuate headband, respectively. The battery is connected to each of the two second connector, and is configured to supply power to the first wireless playback device and the second wireless playback device, and the first wireless playback device and the second wireless playback device are detachably connected with the two second connectors.

Specifically, the battery is arranged inside the arcuate headband, and a hidden first connector is provided outside the housing of the arcuate headband. The first connector may be a USB interface connector such as a Type-A interface connector, a Type-B interface connector or a Type-C interface connector, etc. The second connectors arranged at both sides of the arcuate headband, respectively, may be a pin connector including charging pins (such as GND and +5V) and data transmission pins (such as TX and RX), and may also be a USB interface connector such as the TYPE-A interface connector, the TYPE-B interface connector or the TYPE-C interface connector, etc., which is not limited herein.

In other words, while the housings of the first wireless playback device 10 and the second wireless playback device 20 are detachably connected with the headband device 30, the corresponding connector of the first wireless playback device 10 and the second wireless playback device 20 is also connected to the second connector of the headband device 30, so that the battery in the headband device 30 can charge the battery of each wireless playback device. Therefore, the usage time for the user wearing and using the first wireless playback device 10 and the second wireless playback device 20 is increased.

In this embodiment, the housings 11 of the first wireless playback device 10 and the second wireless playback device 20 provided according to embodiments of the present disclosure are detachably connected with the headband device 30, so that the user can use the first wireless playback device 10 and the second wireless playback device 20 in a product form similar to the traditional head-mounted headset. In addition, the processors of the first wireless playback device 10 and the second wireless playback device 20 can control the PA operational amplification device to adjust the operation power mode of the speaker according to the connection condition data collected by the headband detection device 12, so as to realize the function of automatically switching the headphone function and the small speaker function. Therefore, the user experience is improved.

Reference is made to FIG. 5, which is a flow chart of a playback control method of a wireless playback device according to an embodiment of the present disclosure. The method includes step 101 and step 102.

In step 101, a connection condition between a wireless playback device and a headband device is acquired, where the connection condition includes a connected state and an unconnected state.

The object of this step is that a processor of the wireless playback device, such as a Bluetooth chip, acquires the connection condition between the wireless playback device and the headband device, and determines whether a housing of the wireless playback device that is detachably connected with the headband device is connected to the headband. That is, it is determined whether the wireless playback device and the headband device form a product form similar to a traditional head-mounted headset.

In this step, the specific manner for the processor acquiring the connection condition between the wireless playback device and the headband device may be configured by a designer according to practical scenarios and user needs. For example, in a case that the headband device is provided with a charging function, to ensure the stability of charging, the housing of the wireless playback device is connected to the headband device if a connector configured to power the wireless playback device in the headband device is connected to a corresponding connector of the wireless playback device. Therefore, the processor directly acquires the connection condition between the wireless playback device and the headband device according to a power connection condition between the wireless playback device and the headband device. To ensure the accuracy and real-time performance of the acquired connection condition, a headband detection device is configured on a corresponding position where the headband device is connected to the housing of the wireless playback device, so that the processor determines the connection condition between the housing of the wireless playback device and the headband device according to the connection condition data collected by the headband detection device. That is, in this step, the processor acquires the connection condition between the wireless playback device and the headband device according to the headband detection device configured on the wireless playback device, as long as the processor can acquire the connection condition between the wireless playback device and the headband device, which is not limited herein.

In step 102, a power amplifier (PA) operational amplification device is controlled, according to the connection condition, to adjust an operation power mode of the speaker. The PA operational amplification device and the speaker are both provided in the wireless playback device.

The object of this step is that the processor controls, according to the connection condition between the wireless playback device and the headband device, the PA operational amplification device of the wireless playback device to adjust the operation power mode of the speaker, so as to ensure that the operation power mode of the speaker corresponds to the user's needs.

Correspondingly, in this step, the specific manner for the processor controlling the PA operational amplification device to adjust an operation power mode of the speaker according to the connection condition may be configured by a designer according to practical scenarios and user needs. Only the connection condition between the wireless playback device and the headband device may be utilized to determine the user's needs. For example, if the connection condition is a connected state, it is determined that the user needs to use a function of the wireless playback device as headphones, and then the processor controls the PA operational amplification device to adjust the speaker to operate in a low power mode. If the connection condition is an unconnected state, it is determined that the user needs to use a function of the wireless playback device as small speakers, and then the processor controls the PA operational amplification device to adjust the speaker to operate in a high power mode. Both the connection condition between the wireless playback device and the headband device and a wearing condition of the wireless playback device may also be utilized to determine the user's needs. That is, the processor controls the PA operational amplification device, according to the connection condition and the acquired wearing condition of the wireless playback device, to adjust the operation power mode of the speaker. Also, the connection condition between the wireless playback device and the headband device and a pairing state between the wireless playback device and other wireless playback devices may further be utilized to determine the user's needs. That is, the processor controls the PA operational amplification device, according to the connection condition and the acquired pairing state between the wireless playback device and other wireless playback devices, to adjust the operation power mode of the speaker, which is not limited herein.

Specifically, the specific structure and type of the PA operational amplification device in this step may be configured by a designer according to practical scenarios and user needs, as long as the PA operational amplification device can, according to the control of the processor, adjust the operation power mode of the connected speaker and change the sound pressure level of the audio played by the speaker, which is not limited herein.

For clarification, the processor can not only control the PA operational amplification device to adjust the operation power mode of the speaker according to the connection condition, but also control the activation and deactivation of an active noise cancellation (ANC) device on the wireless playback device according to the connection condition. For example, after that the processor controls the PA operational amplification device to adjust the speaker to operate in the low power mode, the processor may also control the ANC device to perform active noise cancellation on the audio played by the speaker. That is, the ANC function of earphones of the wireless playback device is realized. Correspondingly, after that the processor controls the PA operational amplification device to adjust the speaker to operate in the high power mode, the processor may also control the ANC device to stop the active noise cancellation on the audio played by the speaker. That is, the ANC is shut when the function of the wireless playback device as small speakers is realized.

In this embodiment, the processor controls the PA operational amplification device, according to the connection condition between the wireless playback device and the headband devices, to adjust the operation power mode of the speaker, so that the function of automatically switching the headphone function and the small speaker function is realized. Therefore, the user experience is improved.

Figure 6:
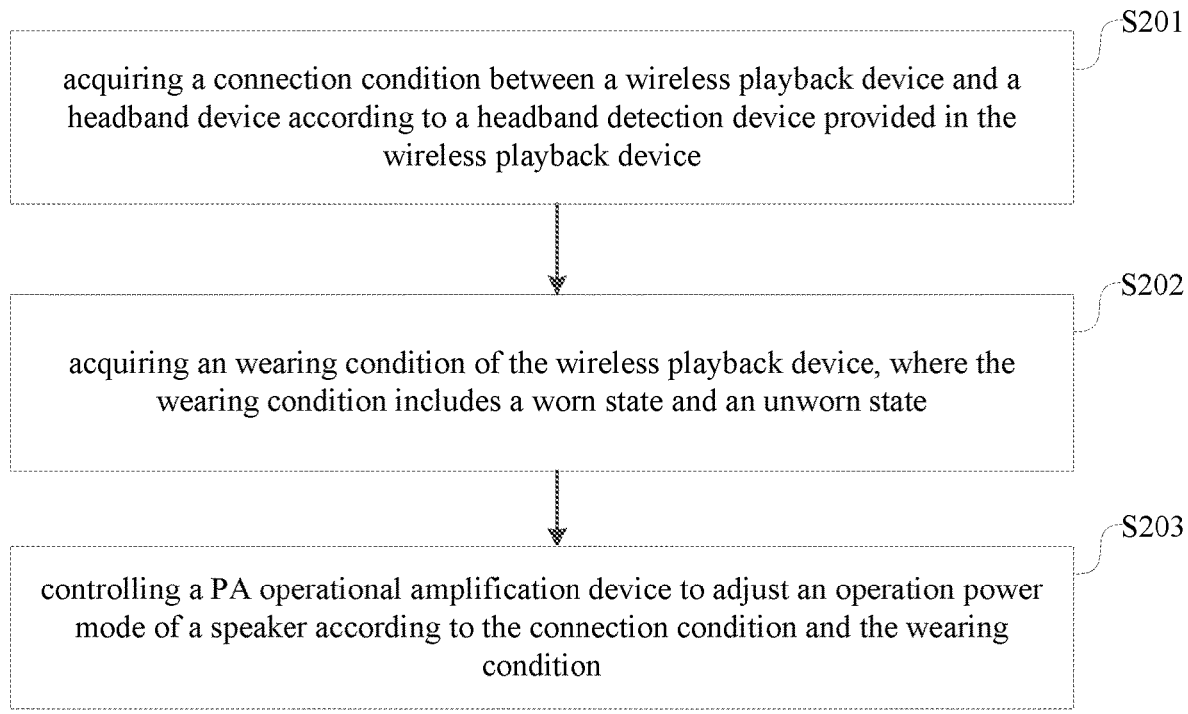
FIG. 6 is a flow chart of another playback control method of a wireless playback device according to an embodiment of the present disclosure.

Reference is made to FIG. 6, which is a flow chart of another playback control method of a wireless playback device according to an embodiment of the present disclosure. The method includes steps of 201 to 203.

In step 201, the connection condition between the wireless playback device and the headband device is acquired according to a headband detection device provided in the wireless playback device.

The object of this embodiment is that the processor uses the connection condition data collected by the headband detection device provided in the wireless playback device to determine the connection condition between the wireless playback device and the headband device. Specifically, the specific type of the above connection condition data, that is, the specific type of the headband detection device, may be configured by a designer according to the practical scenarios and user needs. For example, when the headband detection device is an interrupt detection circuit, at the bottom of a headband jack in the housing of the wireless playback device, as shown in FIG. 3, the connection condition data is a voltage signal detected by a signal input terminal of the processor. That is, the processor determines whether it receives the interrupt signal sent by the interrupt detection circuit (a GPIO interrupt, which means the voltage is zero) in this step. When the headband device is connected to the wireless playback device, the interrupt detection circuit sends the interrupt signal. That is, if the interrupt signal is sent, a connected state is determined as the connection condition; otherwise, an unconnected state is determined as the connection condition. When the headband detection device can also be a distance sensor, such as an infrared sensor mounted at the bottom of the headband jack in the housing of the wireless playback device, the connection condition data is the distance data sent by the distance sensor. That is, in this step, the processor determines whether the distance corresponding to the received distance data sent by the distance sensor is less than the threshold. If the distance is less than the threshold, the connected state is determined as the connection condition; otherwise, the unconnected state is determined as the connection condition, which is not limited herein.

In step 202, n wearing condition of the wireless playback device is acquired, and the wearing condition includes a worn state and an unworn state.

The object of this step is that the processor acquires the wearing condition of the wireless playback device to determine whether the user places or wears the wireless playback device to an ear for use. That is, in a case that the wearing condition is the worn state, it is determined that the user has already placed or is wearing the wireless playback device to the ear, such as a state that the user holds the wireless playback device to an ear, a state that the user wears the wireless playback device with an ear-hook, or a state that the user wears the wireless playback with its housing connected to a headband device. In a case that the wearing condition is the unworn state, the wireless playback device is not placed or worn to the ear for use.

Specifically, the specific manner of the processor acquiring the wearing condition of the wireless playback device in this step may be implemented in the same or a similar manner as a wearing detection scheme of the in-ear or semi-in-ear TWS Bluetooth headsets in conventional technologies. For example, the wearing condition of the wireless playback device may be acquired according to a distance sensor and/or an acceleration sensor provided in the wireless playback device, which is not limited herein.

It is understandable that there is no logical sequence between this step and step 201. As shown in the embodiment, step 201 is performed first, and then this step is performed. Alternatively, the order of this step and step 201 may be exchanged, or this step and step 201 may also be performed at the same time, which is not limited herein.

In step 203, the PA operational amplification device is controlled to adjust the operation power mode of the speaker according to the connection condition and the wearing condition.

The object of this step is that the processor controls, according to the connection condition between the wireless playback device and the headband device and the wearing condition of the wireless playback device, the PA operational amplification device on the wireless playback device to adjust the operation power mode of the speaker, so as to ensure that the operation power mode of the speaker corresponds to the user's needs.

Correspondingly, in this step, the specific manner for the processor, according to the connection condition and the wearing condition, controlling the PA operational amplification device to adjust an operation power mode of the speaker may be configured by a designer according to practical scenarios and user needs. For example, the processor determines whether the connection condition between the wireless playback device and the headband device is the connected state and whether the wearing condition of the wireless device is the worn state, respectively. In a case that the wearing condition is the worn state, it is determined that the user needs to use a function of the wireless playback device as earphones, and then the processor controls the PA operational amplification device to adjust the speaker to operate in a low power mode. In a case that the wearing condition is the unworn state and the connection condition is the unconnected state, it is determined that the user needs to use a function of the wireless playback device as small speakers, and then the processor controls the PA operational amplification device to adjust the speaker to operate in a high power mode, which is not limited herein.

Correspondingly, in a case that the wearing condition is the unworn state but the connection condition is the connected state, the processor controls the PA operational amplification device to adjust the speaker to operate in either the high power mode or the low power mode, or to stop the speaker from playing audio and enter a standby state, which is not limited herein.

In another embodiment of the present disclosure, after the processor controls the PA operational amplification device to adjust the speaker to operate in the low power mode, the processor controls an active noise cancellation (ANC) device to perform active noise cancellation on the audio played by the speaker. That is, the ANC function of earphones of the wireless playback device is realized. Correspondingly, after that the processor controls the PA operational amplification device to adjust the speaker to operate in the high power mode, the processor controls the ANC device to stop the active noise cancellation on the audio played by the speaker. That is, the ANC is shut when the function of the wireless playback device as small speakers is realized.

In another embodiment of the present disclosure, before the processor control the PA operational amplification device to adjust the speaker to operate in the high power mode, it is determined whether the wearing condition is not the worn state for a preset period. In a case that the determination is positive, the PA operational amplification device is controlled to adjust the speaker to operate in the high power mode. In a case that determination is negative, the speaker is kept operating in the current power mode. This is to avoid a wrong determination for the wearing condition that may cause damage to the user's ears.

In this embodiment, the processor controls the PA operational amplification device, according to the connection condition and the wearing condition, to adjust the operation power mode of the speaker, so that the accuracy of the wireless playback device automatically switching between earphones and small speakers is further improved, and therefore, the user experience is improved.

Figure 7:
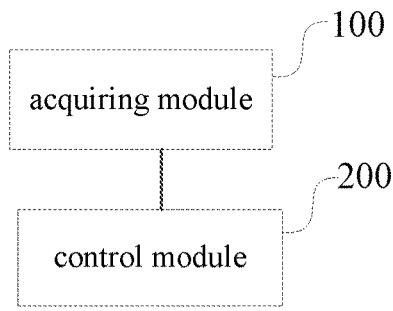
FIG. 7 is a structural diagram of a playback control apparatus of a wireless playback device according to an embodiment of the present disclosure.

Reference is made to FIG. 7, which is a structural diagram of a playback control apparatus of a wireless playback device according to an embodiment of the present disclosure. The apparatus includes an acquiring module 100 and a control module 200.

The acquiring module 100 is configured to acquire a connection condition between a wireless playback device and a headband device, and the connection condition includes a connected state and an unconnected state.

The control module 200 is configured to control a PA operational amplification device to adjust an operation power mode of the speaker according to the connection condition, and the PA operational amplification device and the speaker are both provided in the wireless playback device.

In an embodiment of the present disclosure, the control module 200 includes a first control sub-module and a second control sub-module.

The first control sub-module is configured to control the PA operational amplification device to adjust the speaker to operate in a low power mode, in a case that the connection condition is the connected state.

The second control sub-module is configured to control the PA operational amplification device to adjust the speaker to operate in a high power mode, in a case that the connection condition is the unconnected state.

In an embodiment of the present disclosure, the control module 100 includes a detection acquiring sub-module.

The detection acquiring sub-module is configured to acquire the connection condition according to a headband detection device provided in the wireless playback device.

In an embodiment of the present disclosure, in a case that the headband detection device is specifically an interrupt detection circuit, the detection acquiring sub-module includes a first determining unit, a first determination unit, and a second determination unit.

The first determining unit is configured to determine whether an interrupt signal sent by the interrupt detection circuit is received, and when the headband device is connected to the wireless playback device, the interrupt detection circuit sends the interrupt signal.

The first determination unit is configured to determine the connection condition is the connected state, in a case that the interrupt signal sent by the interrupt detection circuit is received.

The second determination unit is configured to determine the connection condition is the unconnected state, in a case that the interrupt signal sent by the interrupt detection circuit is not received.

In an embodiment of the present disclosure, the control module 200 includes an acquiring sub-module and a third control sub-module.

The acquiring sub-module is configured to acquire a wearing condition of the wireless playback device, and the wearing condition includes a worn state and an unworn state.

The third control sub-module is configured to control the PA operational amplification device to adjust the operation power mode of the speaker according to the connection condition and the wearing condition.

In an embodiment of the present disclosure, the third control sub-module includes a second determining unit, a third determining unit, a first control unit, a stopping unit, a fourth determining unit, a second control unit, and a third control unit.

The second determining unit is configured to determine whether the connection condition is the connected state.

The third determining unit is configured to determine whether the wearing condition is the worn state, in a case that the connection condition is the connected state.

The first control unit is configured to control the PA operational amplification device to adjust the speaker to operate in the low power mode, in a case that the wearing condition is the worn state.

The stopping unit is configured to stop the speaker from playing audio, in a case that the wearing condition is the worn state.

The fourth determining unit is configured to determine whether the wearing condition is the worn state, in a case that the connection condition is not the connected state.

The second control unit is configured to control the PA operational amplification device to adjust the speaker to operate in the low power mode, in a case that the wearing condition is the worn state.

The third control unit is configured to control the PA operational amplification device to adjust the speaker to operate in the high power mode, in a case that the wearing condition is not the worn state.

In an embodiment of the present disclosure, the third control unit includes a determining sub-unit and a control sub-unit.

The determining sub-unit is configured to determine whether the wearing condition is not at the worn state for a preset period.

The control sub-unit is configured to control the PA operational amplification device to adjust the speaker to operate in the high power mode, in a case that the wearing condition is not at the worn state for the entire preset period.

In an embodiment of the present disclosure, both of the first control unit and the second control unit include an active noise cancellation (ANC) activating sub-unit.

The ANC activating sub-unit is configured to control an ANC device to perform active noise cancellation on an audio played by the speaker, and the ANC device is provided in the wireless playback device.

Correspondingly, the third control unit includes an ANC deactivating sub-unit.

The ANC deactivating sub-unit is configured to control the ANC device to stop the active noise cancellation on the audio played by the speaker.

In the embodiment, the control module 200 controls the PA operational amplification device, according to the connection condition between the wireless playback device and the headband devices, to adjust the operation power mode of the speaker, so that the function of automatically switching the headphone function and the small speaker function is realized. Therefore, the user experience is improved.

In addition, a computer-readable storage medium is also provided according to an embodiment of the present disclosure. The computer-readable storage medium stores a computer program, and when the computer program is executed by a processor, the steps of the method according to any one of the foregoing embodiments are performed.

The embodiments of the present disclosure are described in a progressive manner, and each embodiment places emphasis on the difference from other embodiments. Therefore, one embodiment can refer to other embodiments for the same or similar parts. For the systems, apparatuses, and computer-readable storage media disclosed in the embodiments, since they correspond to the devices and methods disclosed in the embodiments, the description is relatively simple, and the relevant parts can be referred to the description of the methods.

Those skilled in the art shall further realize that the units and algorithm steps of each example described in combination with the embodiments disclosed herein can be implemented by electronic hardware, computer software, or a combination of both. In order to clearly illustrate the interchangeability of hardware and software, the composition and steps of each example have been generally described in accordance with the function in the above description. Whether these functions are executed by hardware or software depends on the specific application and design constraints of the technical solution. Those skilled in the art and technicians can use different methods for each specific application to implement the described functions, but such implementation shall not be considered as going beyond the scope of the present disclosure.

A wireless playback device, a head-mounted wireless headset system, a playback control method and apparatus of a wireless playback device, and a computer-readable storage medium provided according to embodiments of the present disclosure have been described in detail above. Specific examples are used in this article to illustrate the principle and implementation of the present disclosure. The description of the above examples is only used to help understand the method and core idea of the present disclosure. It should be pointed out that for those skilled in the art, without departing from the principle of the present disclosure, several improvements and modifications can be made to the present disclosure, and these improvements and modifications also fall within the protection scope of the claims of the present disclosure.

The invention claimed is:

1. A wireless playback device, comprising:
    a housing, a headband detection device, a processor, a power amplifier (PA) operational amplification device, and a speaker;
    wherein the headband detection device, the processor, the PA operational amplification device and the speaker are provided in the housing;
    wherein the headband detection device is configured to collect connection condition data of a headband device and the housing;
    wherein the processor is connected to the headband detection device, and is configured to control, according to the connection condition data, the PA operational amplification device to adjust an operation power mode of the speaker; and
    wherein the PA operational amplification device is connected to the processor and the speaker respectively, and is configured to adjust the operation power mode of the speaker according to control of the processor.

2. The wireless playback device according to claim 1, further comprising:
    an active noise cancellation device provided in the housing;

wherein the active noise cancellation device is connected to the processor, and is configured to perform active noise cancellation on an audio played by the speaker according to the control of the processor.

3. The wireless playback device according to claim 2, wherein the housing is provided with a headband jack, and the headband jack is configured for detachably connecting with the headband device plugged into the headband jack.

4. The wireless playback device according to claim 1, further comprising:
a wearing detection device provided in the housing;
wherein the wearing detection device is connected to the processor, and is configured to detect wearing condition data of the wireless playback device according to the control of the processor; and
wherein the processor is configured to control, according to the connection condition data and the wearing condition data, the PA operational amplification device to adjust the operation power mode of the speaker.

5. The wireless playback device according to claim 4, wherein the wearing detection device is a distance sensor and/or an acceleration sensor.

6. The wireless playback device according to claim 5, wherein the housing is provided with a headband jack, and the headband jack is configured for detachably connecting with the headband device plugged into the headband jack.

7. The wireless playback device according to claim 4, wherein the housing is provided with a headband jack, and the headband jack is configured for detachably connecting with the headband device plugged into the headband jack.

8. The wireless playback device according to claim 1, wherein the housing is provided with a headband jack, and the headband jack is configured for detachably connecting with the headband device plugged into the headband jack.

9. The wireless playback device according to claim 8,
wherein the headband detection device is an interrupt detection circuit, and the interrupt detection circuit comprises a resistor and a key switch provided at a bottom of the headband jack;
wherein a first end of the resistor is connected to a signal input terminal of the processor, a common end of the resistor and the processor is connected to a first end of the key switch, a second end of the resistor is connected to an output terminal of a preset power supply, and a second end of the key switch is grounded.

10. The wireless playback device according to claim 8, wherein the headband detection device is a distance sensor.

11. A head-mounted wireless headset system, comprising:
a headband device;
a first wireless playback device; and
a second wireless playback device;
wherein the headband device is detachably connected with a housing of the first wireless playback device and a housing of the second wireless playback device, respectively, and each of the first wireless playback device and the second wireless playback device is the wireless playback device according to claim 1.

12. The head-mounted wireless headset system according to claim 11, wherein the headband device comprises an arcuate headband, a battery, a first connector, and two second connectors;
wherein the battery, the first connector and the two second connectors are provided in the arcuate headband;
wherein the first connector is connected to the battery, and is configured to detachably connect with an external power supply device to charge the battery;
wherein the two second connectors are respectively provided at both ends of the arcuate headband; and
wherein the battery is connected to each of the two second connectors and is configured to supply power to the first wireless playback device and the second wireless playback device, and the first wireless playback device and the second wireless playback device are detachably connected with the two second connectors.

13. A playback control method of a wireless playback device, comprising:
acquiring a connection condition between a wireless playback device and a headband device, wherein the connection condition comprises a connected state and an unconnected state; and
controlling, according to the connection condition, a power amplifier (PA) operational amplification device to adjust an operation power mode of a speaker, wherein the PA operational amplification device and the speaker are both provided in the wireless playback device.

14. The playback control method according to claim 13, wherein the controlling, according to the connection condition, the PA operational amplification device to adjust the operation power mode of the speaker comprises:
controlling, in a case that the connection condition is the connected state, the PA operational amplification device to adjust the speaker to operate in a low power mode; and
controlling, in a case that the connection condition is the unconnected state, the PA operational amplification device to adjust the speaker to operate in a high power mode.

15. The playback control method according to claim 13, wherein the acquiring the connection condition between the wireless playback device and the headband device comprises:
acquiring the connection condition according to a headband detection device provided in the wireless playback device.

16. The playback control method according to claim 15, wherein the headband detection device is an interrupt detection circuit, and the acquiring the connection condition according to the headband detection device provided in the wireless playback device comprises:
determining whether an interrupt signal sent by the interrupt detection circuit is received, wherein the interrupt detection circuit sends the interrupt signal when the headband device is connected to the wireless playback device;
determining, in a case that the interrupt signal is received, that the connection condition is the connected state; and
determining, in a case that the interrupt signal is not received, that the connection condition is the unconnected state.

17. The playback control method according to claim 13, wherein the controlling, according to the connection condition, the PA operational amplification device to adjust the operation power mode of the speaker comprises:
acquiring a wearing condition of the wireless playback device, wherein the wearing condition comprises a worn state and an unworn state; and
controlling, according to the connection condition and the wearing condition, the PA operational amplification device to adjust the operation power mode of the speaker.

18. The playback control method according to claim 17, wherein the controlling, according to the connection condition and the wearing condition, the PA operational amplification device to adjust the operation power mode of the speaker comprises:
  determining whether the connection condition is the connected state;
  in a case that the connection condition is the connected state, determining whether the wearing condition is the worn state;
    controlling, in a case that the wearing condition is the worn state, the PA operational amplification device to adjust the speaker to operate in a low power mode; and
    stopping, in a case that the wearing condition is not the worn state, the speaker from playing audio; and
  in a case that the connection condition is not the connected state, determining whether the wearing condition is the worn state;
    controlling, in a case that the wearing condition is the worn state, the PA operational amplification device to adjust the speaker to operate in the low power mode; and
    controlling, in a case that the wearing condition is not the worn state, the PA operational amplification device to adjust the speaker to operate in a high power mode.

19. The playback control method according to claim 18, wherein before the controlling the PA operational amplification device to adjust the speaker to operate in the high power mode, the method further comprises:
  determining whether the wearing condition is not the worn state within a preset time period; and
  controlling, in a case that the wearing condition is not the worn state within the preset time period, the PA operational amplification device to adjust the speaker to operate in the high power mode.

20. The playback control method according to claim 18, wherein, after the controlling the PA operational amplification device to adjust the speaker to operate in the low power mode, the method further comprises:
  controlling an active noise cancellation device to perform active noise cancellation on an audio played by the speaker, wherein the active noise cancellation device is provided in the wireless playback device;
  wherein after the controlling the PA operational amplification device to adjust the speaker to operate in the high power mode, the method further comprises:
  controlling the active noise cancellation device to stop performing active noise cancellation on the audio played by the speaker.

\* \* \* \* \*